United States Patent [19]

Allner et al.

[11] 3,745,468

[45] July 10, 1973

[54] CIRCUIT ARRANGEMENT FOR TUNING AND MECHANICAL DISPLAY OF THE TUNING FREQUENCY FOR HIGH FREQUENCY RECEIVERS WITH CAPACITIVE DIODE TUNING

[76] Inventors: Olaf Allner, Dresdner Str. 12; Willy Kanow, Reichssportfeldstr. 16 , both of Berlin, Germany

[22] Filed: Oct. 1, 1971

[21] Appl. No.: 188,680

[30] Foreign Application Priority Data

Oct. 14, 1970 Germany .................. P 20 51 415.2

[52] U.S. Cl. ................. 325/455, 325/421, 329/111, 329/126, 334/15

[51] Int. Cl. .............................................. H03d 3/00

[58] Field of Search .......................... 334/14, 15, 30; 329/104, 111, 126; 325/318, 349, 455, 456, 458, 452, 453–459, 416, 418, 420–423

[56] References Cited

UNITED STATES PATENTS

| | | | |
|---|---|---|---|
| 3,249,876 | 5/1966 | Harrison | 334/15 |
| 3,426,151 | 2/1969 | Tygart | 325/349 X |
| 3,439,283 | 4/1969 | Danielson | 329/104 |
| 3,569,838 | 3/1971 | Blair et al. | 325/423 |

*Primary Examiner*—Benedict V. Safourek
*Attorney*—Olaf Allner

[57] ABSTRACT

In a high frequency receiver circuit arrangement for tuning and for mechanical display of the tuning frequency for high frequency receivers operating with capacity diode tuning, in particular radio and television receiver sets, a DC voltage obtained from the receiver oscillator circuit containing the capacity diode by means of a converter or frequency DC voltage-transformer changing a frequency to a direct voltage is compared in a symmetrical direct voltage amplifier which is designed for instance as a differential amplifier with a second adjustable DC voltage. This latter voltage corresponds to the required frequency value tapped off from a potentiometer the setting of which is simultaneously displayed for example on a frequency scale. The output DC voltage of said DC amplifier is used for controlling the capacity diode of said oscillator circuit in order to assure an oscillator frequency value which corresponds to said given second DC voltage. An important feature consists in that said potentiometer and said frequency/DC voltage transformer are connected to the same terminal of the operating source.

6 Claims, 3 Drawing Figures

Figure 1:
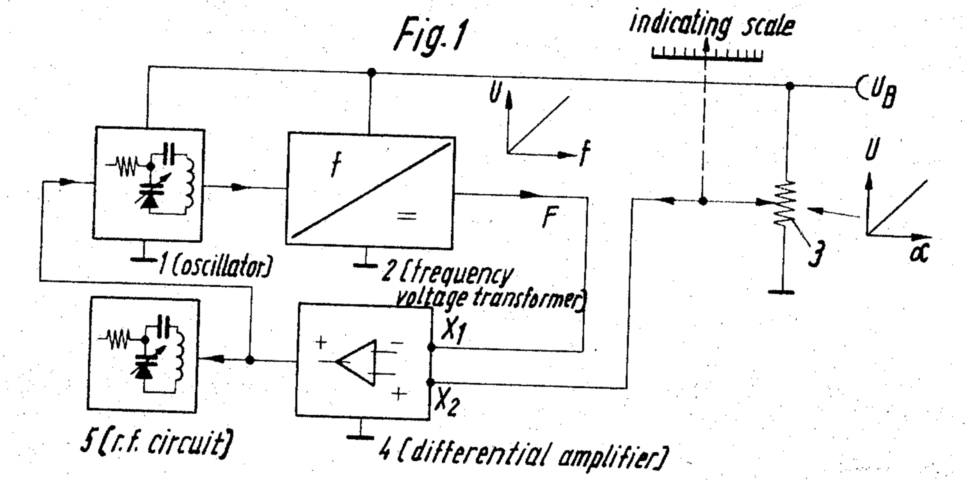

Inventors:

CIRCUIT ARRANGEMENT FOR TUNING AND MECHANICAL DISPLAY OF THE TUNING FREQUENCY FOR HIGH FREQUENCY RECEIVERS WITH CAPACITIVE DIODE TUNING

The invention relates to a circuit arrangement for tuning and mechanical display of the tuning frequency for high frequency receivers with capacitive diode tuning, in particular radio or television receiver sets, and is intended to overcome the difficulties which in the past were encountered in connection with efforts to achieve precise display of stations on the associated display scale of the set and which in particular can be traced back to the spread in the characteristics of the individual diodes employed for the capacitive diode tuning system. The circuit in accordance with the invention permits production of series manufacturable radio sets with AM capacitive diode tuning with a reading-accuracy on the scale amounting to a maximum of ± 3 percent of the length of the scale, a value which is in general considered adequate for series manufacture of radio sets of such types.

Known devices of this type have employed the following means to overcome the difficulties mentioned above:

1. Potentiometers with resistance characteristics adjustable by means of several tappings and connected trimming potentiometers so that the characteristics of the diode and the control can be trimmed to coincide at least at several points.
2. Use of groups of diodes and potentiometers sorted in accordance with the nature of the characteristics.
3. Use of various scale types with different calibrations.

However none of the above solutions is suitable for rational manufacturing processes.

In comparison, a better solution to this problem of achieving exact display of the tuning frequency in the case of capacitive diode tuning has already been proposed which consists in a method whereby the potentiometer for adjusting the frequency (tuning) is still employed but is not mechanically connected to the pointer of the display scale. The frequency in this case is displayed by what is termed a direct-display frequency measuring instrument. Since this circuit layout requires a moving coil measuring instrument for displaying frequency with a quality class of 2.5, it is too expensive for rational manufacture of radio or television sets so that this method is likewise excluded if rational manufacture of radio and television sets is required.

According to the invention, the circuit arrangement for tuning and mechanical display of the tuning frequency for high frequency receivers by means of capacitive diode tuning is characterized in that a DC voltage, obtained from the oscillator circuit containing the capacitive diode by means of a frequency to direct voltage converter, is compared in a symmetrical direct voltage amplifier preferably designed as a differential amplifier, with a second adjustable DC voltage corresponding to the required frequency value, and in that the output DC voltage of the direct voltage amplifier controls the capacitive diode of the oscillator circuit in such a manner that the oscillator frequency is proportional to the given second DC voltage.

A preferred embodiment employs a principle whereby the second adjustable DC voltage is tapped off at the slider of a potentiometer, the setting of which is at the same time displayed on a scale calibrated in units of frequency.

In addition the circuit in accordance with the invention is designed in such a manner that the frequency to direct voltage converter and the potentiometer are connected to the same operative voltage source so that the operative voltage fluctuations at the output of the frequency to direct voltage converter and at the tap-off point of the potentiometer have the same percentage effect.

The advantage of the circuit arrangement in accordance with the invention lies in the fact that the tuning reading is independent of the receiver voltage itself and that no stabilisation of the DC voltage of the receiver is required. DC voltage fluctuations of ± 15 percent are not noticed with a circuit in accordance with the invention. It is of advantage to employ a differential amplifier as a direct voltage amplifier which is particularly stable against external influences, such as for example operational voltage fluctuations and temperature influences.

Figure 2:
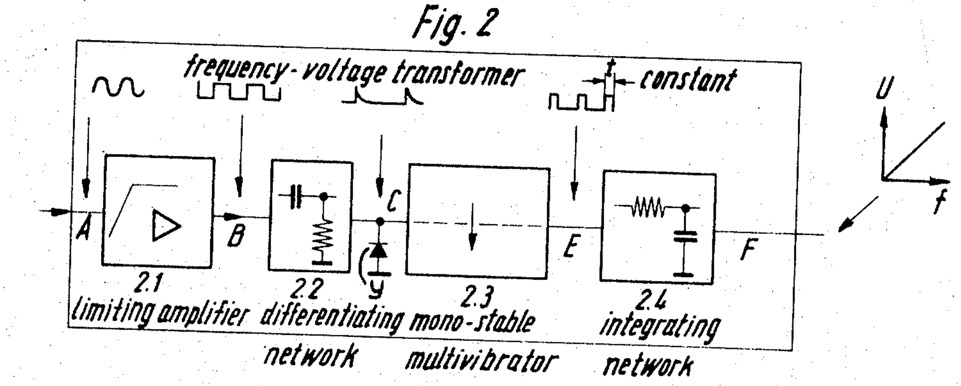
Figure 3:
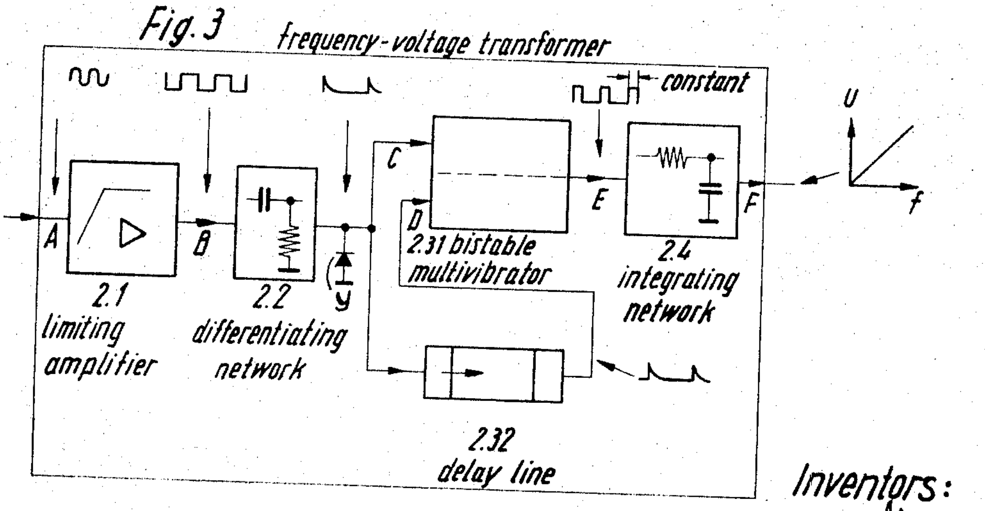

The circuit arrangement in accordance with the invention is described in more detail below on the basis of the exemplary designs represented in the drawings, In these drawings FIG. 1 represents the principle of a tuning circuit for receivers with capacitive diode tuning in accordance with the invention;

FIG. 2 shows an example of the frequency to direct voltage converter in the circuit arrangement in accordance with the invention shown in FIG. 1; and FIG. 3 shows a further embodiment of the frequency to direct voltage converter in accordance with FIG. 2 in which the mono-stable multivibrator is replaced by a different circuit arrangement.

The block diagram in accordance with fIG. 1 shows the principles of design of a circuit arrangement in accordance with the invention for precise frequency tuning of receiver sets with capacity diode tuning. The high frequency signal arriving from the oscillator 1 is fed via the line A to the frequency to direct voltage converter 2 and is transformed in a known manner into a DC voltage proportional to the frequency. This DC voltage at the output of 2 is then fed to the inverting input X1 of the following symmetrical direct voltage amplifier 4 which preferably should take the form of a differential amplifier. A second DC voltage is fed from the slider of the potentiometer 3 to the non-inverting input X2 of the amplifier 4. These two DC voltages acting at the inputs X1 and X2 are compared with one another in the differential amplifier 4 and at the output of the same a DC voltage is produced which finally controls the barrier layer capacity of the tuning diode in oscillator circuit 1 and that of the capacity diode in the prestage 5 respectively. For applications of a general nature (i.e. not for radio an television purposes) this pre-stage can be omitted.

The circuit arrangement in accordance with the invention represented in FIG. 1 operates in the following manner:

The slider path on the potentiometer 3 is calibrated in units of frequency and serves for mechanical display of the frequency as a result of the fact that the slider is connected mechanically to the pointer which connection is symbolized by a dotted line. This pointer displays the frequency setting in each case on an associated scale. If a linear potentiometer is employed then the calibration of the frequency display system may likewise be linear if a system is employed whereby the frequency of the oscillator circuit 1 varies linearly with the slider voltage of the potentiometer 3.

The method of establishing this linearity will now be described in brief. At an assumed frequency *f1*, the voltage at the slider of the potentiometer 3 is assumed to be U1. This voltage U1 thus also acts at the non-inverting input X2 of the amplifier 4 which amplifies said voltage and by means of its output voltage controls the barrier layer capacity of the tuning diode in the oscillator circuit 1 or the pre-stage 5, thus also controlling the frequency of the resonant circuits. The oscillator frequency is converted in the frequency to direct voltage converter 2 into a proportional DC voltage and is fed via the line F to the inverting input of the amplifier 4. If the amplification of the amplifier 4 approaches infinity, i.e. if a very high degree of amplification is incorporated then at the output of the oscillator circuit 1 a corresponding DC voltage will arise and will result in the specific frequency which will generate a voltage at the inverting input X1 which is of the same magnitude as the voltage at the non-inverting input X2 arriving from the slider of the potentiometer 3.

If for example on the above mentioned scale for the pointer coupled mechanically with the slider, a frequency is adjusted which is twice as great as that previously operating (a process amounting to a doubling of the slider voltage) then the voltage on line F will be doubled so that the bridge balance in amplifier 4 is re-established. A doubling of the DC voltage on line F however implies a doubling of the frequency if it is assumed that the frequency to direct voltage conversion in the converter 2 is linear.

In accordance with the invention, the frequency to direct voltage converter 2 and the potentiometer 3 are both connected to the same terminal of the operating voltage UB so that the operating voltage fluctuations at the line F and at the slider of the potentiometer 3 have the same percentage effect.

The explanations associated with FIG. 1 show that for the scale precision and for the temperature behaviour of the frequency with receivers incorporating capacitive diode tuning, the diode characteristics or their behaviour in relationship to the temperature are no longer important. This fact is of great significance since at the present stage of the art only diodes with large spread in individual characteristics and inferior temperature behaviour can be constructed.

In conclusion it can be said that for a circuit in accordance with the invention as shown in FIg. 1, the control 3, the frequency to direct voltage converter 2 and the differential amplifier 4 are responsible for the temperature dependency behaviour. Regulators and differential amplifiers are available with temperature dependency characteristics of adequate quality, but it is somewhat difficult to manufacture frequency to direct voltage converters with good temperature dependency characteristics. Two preferred designs of the frequency to direct voltage converter are therefore described in FIGS. 2 and 3.

FIG. 2 shows a circuit suitable for the frequency to direct voltage converter 2 in FIG. 1. in accordance with this circuit, the oscillator signal arriving via the line A is amplified and limited in a limiting amplifier 2.1. The voltage acting at the output of the same and on the line B is a square-wave voltage with the specific oscillator frequency and with constant amplitude. This square-wave voltage after differentiation in the differentiating network 2.2 and leaking of the negative pulses via a correspondingly connected diode y is fed via the line C to the subsequent monostable multivibrator 2.3. At the output of the same on line E, a square-wave voltage is in turn obtained with rectangular pulses of constant width but with a recurrence time proportional to the frequency. These rectangular pulses are integrated in the subsequent integrator 2.4 so that at the output on line F a DC voltage proportional to the frequency is obtained in the manner shown in the snall adjoining diagram. The width of the rectangular pulses on line E depends on the time constants of the multivibrator 2.3.

The further embodiment represented in FIG. 3 of the frequency to direct voltage converter 2 as shown in FIG. 1 is similar to the circuit in FIG. 2 apart from the fact that for the mono-stable multivibrator 2.3 a different form was chosen consisting of a bistable sweep stage 2.31 in combination with a delay network 2.32 as a result of which the temperature dependence of the width of the pulses on the line E is only a function of the temperature dependence behaviour of the delay network 2.32. The delay network 2.32 can also be constructed in the form of a delay line. At the output of this circuit section in accordance with FIG. 3 similar to the situation at the output of the circuit in accordance with FIG. 2, a DC voltage proportional to the frequency is produced on line F. This DC voltage is fed to the inverting input X1 of the differential amplifier 4 represented in FIG. 1.

Expressed in brief the advantages of the circuit in accordance with the invention are as follows:

1. The required outlay, although representing extra cost, is still justifiable compared with tuning circuits with variable capacitors since with diode tuned circuits the possibility exists of incorporating fixed station tuning and a design can be chosen with an automatic station finding system with electronic tuning as well as with mechanical tuning.

2. Precise display of the frequency.

3. The familiar problems of temperature compensating encountered with diode tuning circuits are reduced to a minimum.

4. The supply voltage need not be stabilised since voltage fluctuations of for example 35 15 percent are permissible.

What we claim is:

1. A circuit arrangement for tuning and mechanical display of the tuning frequency for high frequency receivers operating with capacitive diode tuning comprising a receiver oscillator with a capacitive diode, a frequency/DC voltage transformer for changing a frequency value to a DC voltage, a DC amplifier with two input and one output terminals, a potentiometer resistance from which a second adjustable DC voltage is obtainable corresponding to the required frequency value to be tuned in, an operating DC voltage source, and a tuning indicator scale the pointer of which is coupled mechanically with the slider of said potentiometer resistance thus being adapted to indicate the setting of said slider on said scale in frequency values, the output of said receiver oscillator being connected with the input of said frequency/DC voltage transformer, the output of said latter and the slider of said potentiometer resistance being each connected with different terminals of said input terminals of said DC amplifier in which the DC voltages taken from the output of said frequency/DC voltage transformer and from the slider of said potentiometer resistance are thus compared in order to result in a DC voltage at the output terminal of said DC amplifier, said latter DCvoltage being conducted to said receiver oscillator for controlling the capacitive diode reactance in such a manner that the oscillator frequency is proportional to said second DC voltage derived from the slider of said potentiometer resistance, said frequency/DC voltage transformer and said potentiometer resistance being connected to the same terminal of said operating voltage source.

2. A circuit arrangement as claimed in claim 1, wherein said frequency/DC voltage transformer is designed as a series connection of a limiter amplifier, a differentiating network, a monostable multivibrator, and an integrating network.

3. A circuit arrangement as claimed in claim 1, wherein said frequency/DC voltage transformer is designed as a series connection of a limiter amplifier, a differentiating network, a bistable multivibrator in combination with a delay network which determines the pulse width, and an integrating network.

4. A circuit arrangement as claimed in claim 1, wherein said frequency/DC voltage transformer is designed as a series connection of a limiter amplifier, a differentiating network, a bistable multivibrator in combination with a delay line which determines the pulse width, and an integrating network.

5. A circuit arrangement as claimed in claim 1, wherein said frequencu/DC voltage transformer is designed as a series connection of a limiter amplifier, a differentiating network, a bistable multivibrator in combination with a delay line which determines the pulse width, said delay line being designed as to be adjustable with respect to its time constant value as to permit matching to various frequency range of the oscillator.

6. A circuit arrangement as claimed in claim 1, wherein said potentiometer resistance is constructed as a linear potentiometer resistance which together with said frequency/DC voltage transformer provides for a linear division of frequency on said indicator scale.

* * * * *